United States Patent [19]

Singer

[11] Patent Number: 5,045,345
[45] Date of Patent: Sep. 3, 1991

[54] ENERGY BEAM TREATMENT FOR IMPROVED ADHESION OF COATINGS TO SURFACES

[75] Inventor: Irwin L. Singer, Alexandria, Va.

[73] Assignee: The United States of America as represented by the Secretary of the Navy, Washington, D.C.

[21] Appl. No.: 429,959

[22] Filed: Oct. 31, 1989

[51] Int. Cl.$^5$ .............................................. B05D 3/06
[52] U.S. Cl. .................................. 427/38; 204/192.32; 204/192.37; 427/309; 427/343; 427/376.2; 427/399
[58] Field of Search .................... 427/38, 372.2, 309, 427/343, 376.2, 399; 204/192.32, 192.37

[56] References Cited

U.S. PATENT DOCUMENTS

| | | | |
|---|---|---|---|
| 4,557,037 | 12/1985 | Hanoha et al. | 427/38 |
| 4,615,904 | 10/1986 | Ehrlich et al. | 427/38 |
| 4,849,247 | 7/1989 | Scanlon et al. | 427/34 |

OTHER PUBLICATIONS

Singer et al., "Composition and Structure of $Si_3N_4$ Implanted with Ti' at 900C", Mat. Res. Soc. Symp. Proc, vol. 100, 1988 Materials Research Society.
Singer, "Surface Chemistry and Mechanical Behavior of Silicon Carbide and Silicon Nitride Implanted with Titanium to High Fluences and High Temperatures", Surface and Coatings Technology, 33 (1987), 487–499.
Singer et al., "High Temperature Lubrication of Ceramics by Surface Modification", Surface and Coatings Technology, 37 (1989), 179–192.
Singer et al., "Ion-Beam Alloying and Thermochemistry of Ceramics at High Temperatures", presented by NATO-ASI Conference on Structure-Property.

Primary Examiner—Bernard Pianalto
Attorney, Agent, or Firm—Thomas E. McDonnell; Barry A. Edelberg

[57] ABSTRACT

The coating of a substrate with a coating different from and non-reactive with the substrate is improved by energetic surface alloying of the substrate prior to coating. The ion implantation alters the stoichiometry of the substrate, creating a substrate surface which is reactive with the coating. For example, the bonding of TiN to $Si_3N_4$ is enhanced by implanting the substrate surface with Ti.

10 Claims, 10 Drawing Sheets

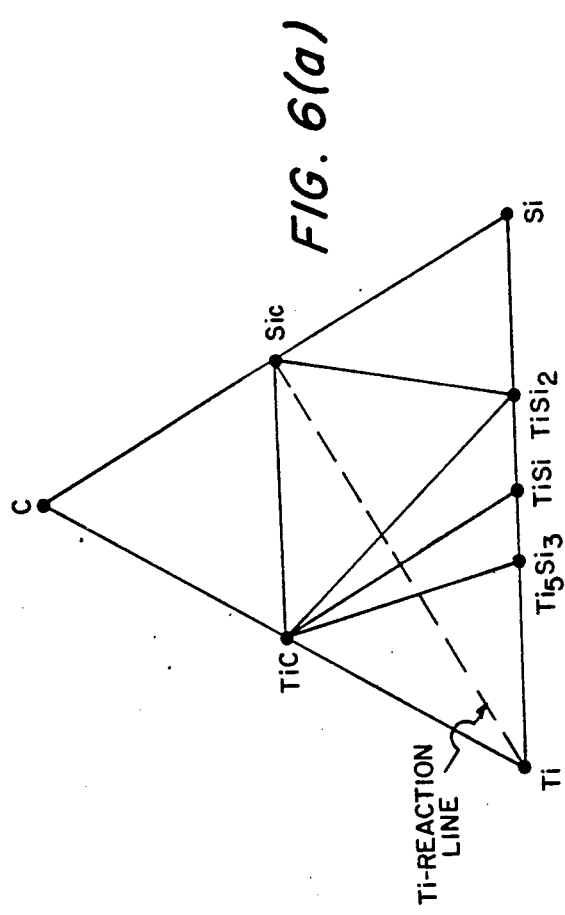
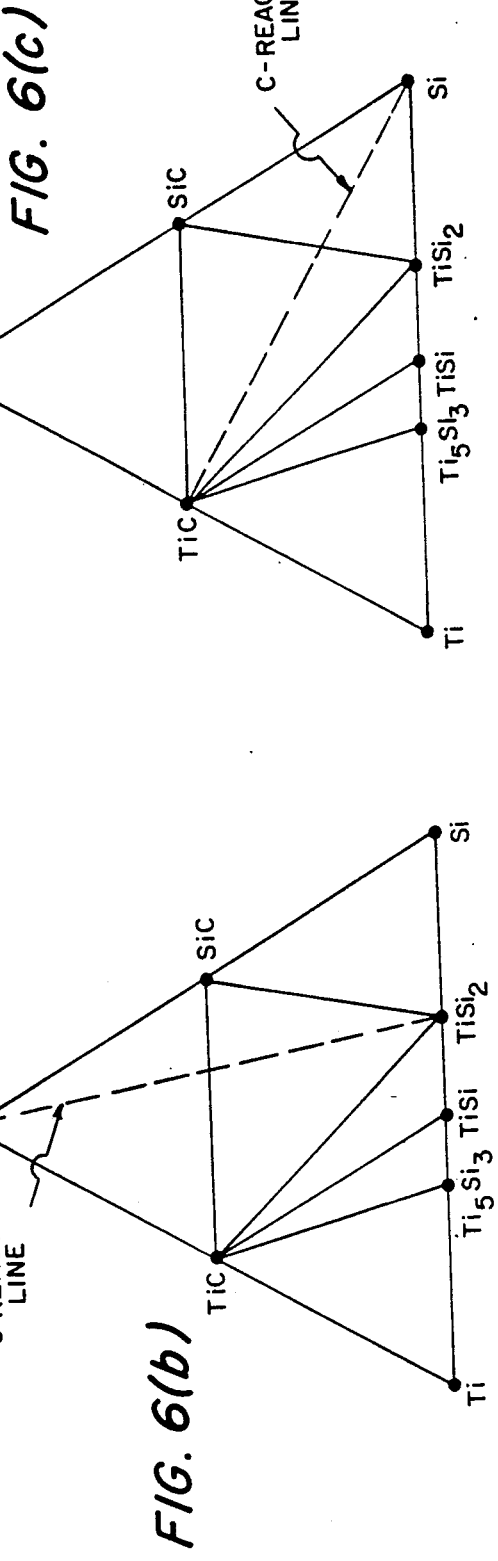
FIG. 6(a)
FIG. 6(b)
FIG. 6(c)

ENERGY BEAM TREATMENT FOR IMPROVED ADHESION OF COATINGS TO SURFACES

BACKGROUND OF THE INVENTION a. Field of the Invention

The present invention relates to engineering materials in general and more specifically to the coating of bulk engineering material with corrosion, oxidation or wear resistant inorganic materials.

b. Background of the Invention

Coatings are needed for protecting engineering components against mechanical, tribological and corrosive/oxidative degradation. In particular, engineering ceramics, by virtue of their light weight, high strength and thermal stability, have great potential for many high temperature applications. However, several of the best and toughest candidate ceramics, e.g. SiC, $Si_3N_4$, and WC, require oxide coatings to resist corrosion and oxidation at high temperatures (900° C. and up). In addition, their application as load-bearing materials is presently limited because of the difficulty of polishing their brittle surface to provide the tough, smooth surface "skins" that bearing components must have.

Conventional film deposition methods can be used to apply protective coatings to ceramics and other engineering materials. Coatings such as $Al_2O_3$ can improve resistance to oxidation and corrosion at high temperatures. Other classes of ceramic coatings such as the nitrides, e.g. TiN, carbides, e.g HfC, or borides, e.g., $TiB_2$, can generate smooth as well as tough, hard-coating surfaces. Unfortunately these coatings do not adhere well to many surfaces, preventing their evaluation and widespread use.

Adhesion is a property of the coating-substrate interface. Although the adhesive strength of a coating does not rely exclusively on chemical bonding, strong atom-atom bonds at the interface promote good adhesion. Thus good adhesion occurs when the coating can "react" with the substrate to form a compound or alloy, and poor adhesion occurs when the coating and substrate are unreactive toward each other.

The failure of ceramic coatings such as TiN and $Al_2O_3$ (and of engineering coatings in general) to adhere to many substrates can be understood by reviewing well-known thermochemical principles. These principles predict the chemical reactivity and compound formation between two multi-element solids, which, in turn, can be described graphically with the aid of phase diagrams. A schematic Ti-N-Si ternary phase diagram in FIG. 1 will be used as an example to discuss the difficulty of adhering TiN coatings to a $Si_3N_4$ ceramic substrate. In general, if any proportion of elements or compounds in the diagram are reacted, three thermodynamically stable phases arise as final products. These "reaction products" will usually differ in type and proportion from the initial reactants. The only exception to this rule is where the constituents are elements or compounds that lie on a "tie line" (solid line), e.g. the line connecting TiN to $Si_3N_4$. In this case, the final products are the same (in type and proportion) as the initial ones. Since TiN and $Si_3N_4$ are connected by a tie line, thermodynamics predicts that the two compounds won't react, i.e., a mixture of the two compounds results in no new compound formation. Thus, the bonding of TiN coatings to $Si_3N_4$ lacks assistance from a chemical driving force.

SUMMARY OF THE INVENTION

It is an object of the present invention to overcome the above-stated deficiencies of the prior art.

It is another object of the present invention to improve the resistance of engineering materials to oxidation, corrosion and wear at high temperatures.

It is a further object of the present invention to coat ceramic and metal substrates with well-adhered ceramic or metal coatings.

It is yet another object of the present invention to produce an engineering ceramic or metal substrate coated with a protective ceramic or metal coating.

These and other objects are achieved by coating a substrate with a coating different from and thermodynamically stable with respect to the substrate. The substrate is ion implanted or surface alloyed using an energetic beam of an element of the substrate or coating, or an element within the same periodic group as that element. The ion implantation or energetic beam surface alloying changes the stoichiometry of the substrate, creating a phase which is reactive with the coating to be applied. The thus altered substrate is then coated with the coating and thermally activated.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein:

FIGS. 6a-6c are schematic Ti-C-Si ternary phase diagrams showing reaction lines (FIG. 6a) Ti with SiC, (FIG. 6b) C with $TiSi_2$ and (FIG. 6c) Si with TiC.

FIG. 15a, left side, shows before heat/oxidation treatment; FIG. 15b, right side, shows after heat/oxidation treatment (in air at 850° C.).

DETAILED DESCRIPTION OF THE INVENTION

Figure 1:
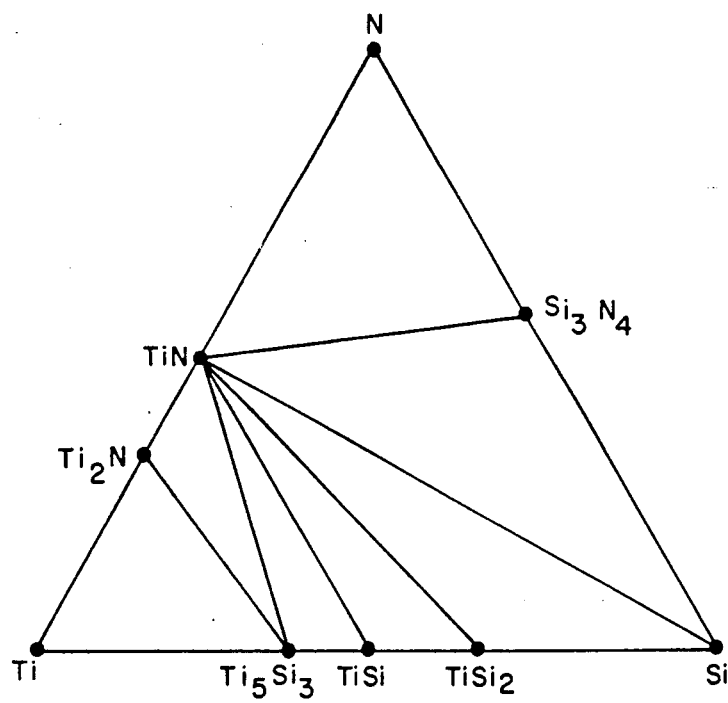
FIG. 1 is a schematic Ti-N-Si ternary phase diagram used to illustrate the difficulty of obtaining adherent TiN coatings on a $Si_3N_4$ ceramic substrate.

The present invention coats bulk engineering materials or metals with oxidation, corrosion or wear resistant ceramics. The thus produced products are particularly useful as bearings and seals, and have numerous other utilities.

The present invention promotes adhesion between inorganic bulk and inorganic coating engineering materials which lack reactivity toward each other by changing the composition of the substrate to provide a stoichiometric excess of at least one atomic species which can be shared by the coating and substrate along the interface. The composition of the substrate is altered by energetic beam implantation of an appropriate atomic species. Most often, the implanted species will be an element of the coating or substrate, depending upon well-known thermochemical principles. For example these principles are discussed in O. Kubaschewski and C. B. Alcock, "Metallurgical Thermochemistry," 5th edition (Pergamon Press, Oxford, 1979), incorporated by reference herein. Elements within the same group as an element within the substrate or coating which thermodynamic principles predict could be "shared" by the coating and substrate could be substituted for that substrate. Nevertheless, this substitution increases the number of phases which must be accounted for, and thus requires a somewhat more complex analysis than that needed for implantation of an atomic species originally included within the substrate or coating.

Throughout the present specification, and the claims that follow, the term "engineering material" refers to a material having strength, wear, oxidation, temperature or corrosion characteristics suitable for its use as a physical structure, such as a boat, a ship, a road, land vehicle, an airplane a building or an appliance, or a coating upon such a structure. The term "bulk engineering material" refers to a material which, besides meeting the above definition of a structural material, can be self-supporting. The term "coating material" refers to an engineering material, which can be coated as a thin, non-self supporting layer upon a bulk engineering material to enhance the wear-resistance, corrosion-resistance, and temperature resistance of the coated substrate surface. Typically, both coating materials and bulk engineering materials include metals (both elemental and alloyed) and ceramics.

The first embodiment of the present invention promotes bonding between coating and substrate materials that share a common element by altering the stoichiometry of the substrate such that the coating and substrate compositions no longer line along their common tie-line. A preferred method is energetic beam alloying with an element of the coating that does not rest along a tie line with the substrate, which creates nascent coating compound within the substrate surface. A second method is energetic beam alloying with an element of the substrate to alter its stoichiometry, again so that the coating and the altered substrate compositions no longer line along a common tie-line. The third and fourth methods of altering stoichiometry are by ion-beam sputtering, which chemically reduces compounds and by thermal desorption, by which the lowest vapor pressure species is selectively desorbed. The latter two methods achieve compositions similar to that of method two.

After the composition of the substrate has been altered as described above, the coating is applied to the substrate. The coated substrate is then thermally activated, by heating or other means, to promote atomic intermixing and bond formation by enhanced diffusion.

Figure 2:
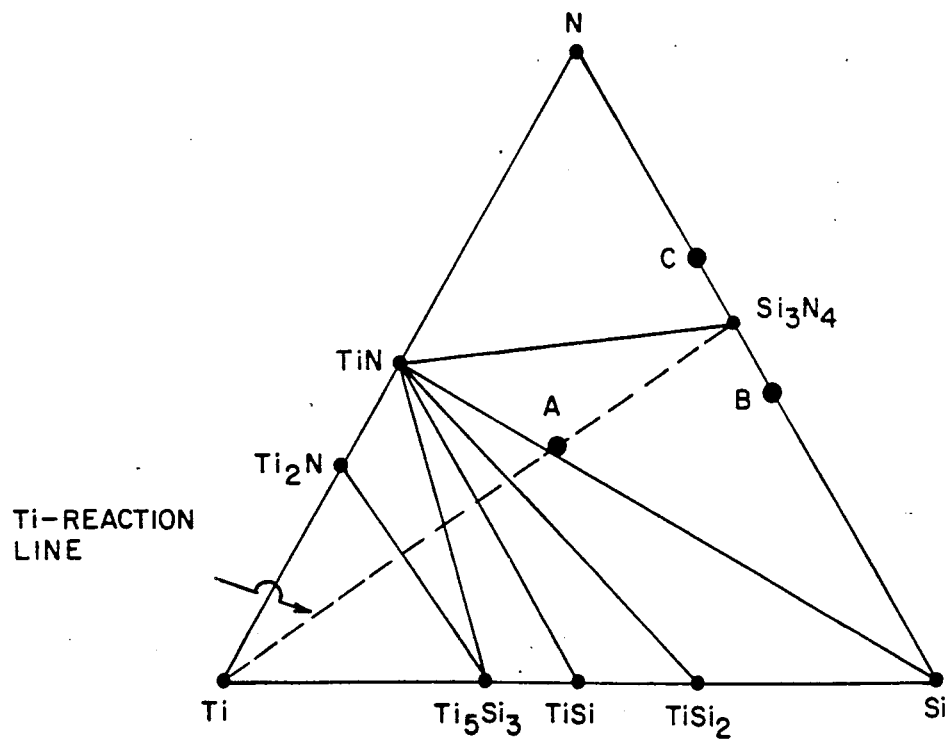
FIG. 2 is a ternary phase diagram for Si-N-Ti showing the Ti reaction line and three possible surface alloyed compositions.
Figure 3:
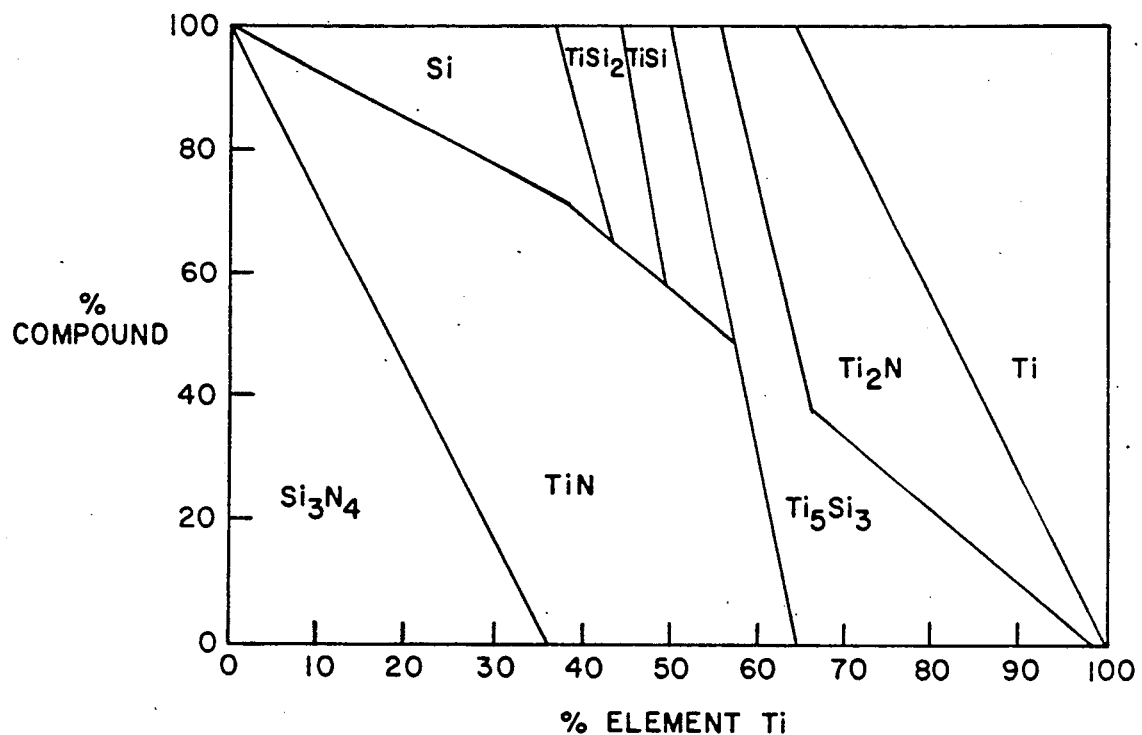
FIG. 3 gives the calculated percentage of binary compounds in the Ti-Si-N ternary system as a function of the percentage of elemental Ti.
Figure 4:
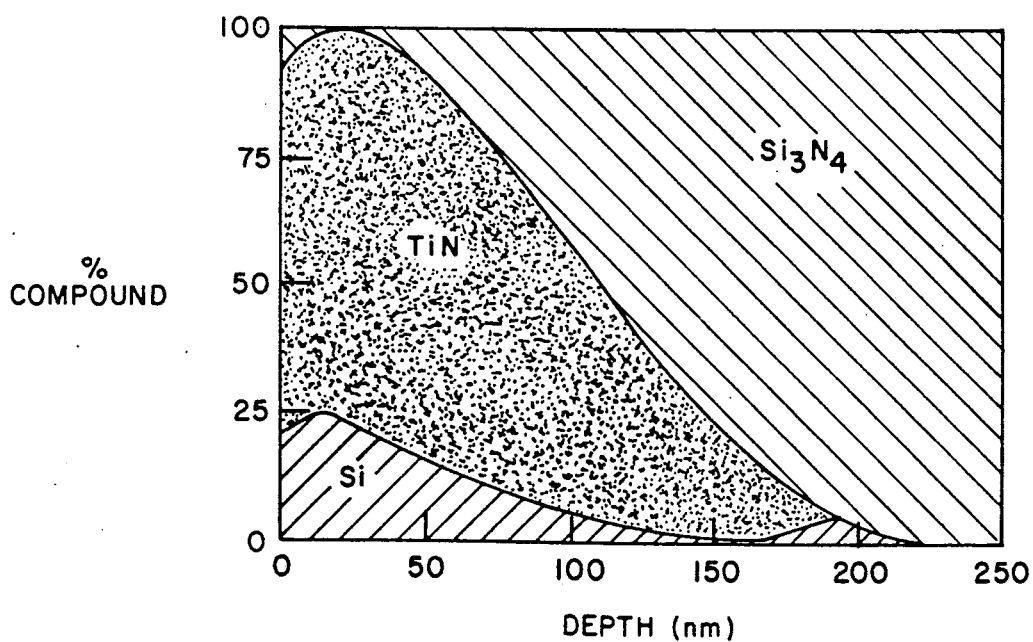
FIG. 4 is a composition vs depth profile (by Auger analysis) of Ti implanted to $5 \times 10^{17}$ ions/cm² at 170 keV into $Si_3N_4$ heated lo to about 820° C.
Figure 5B:
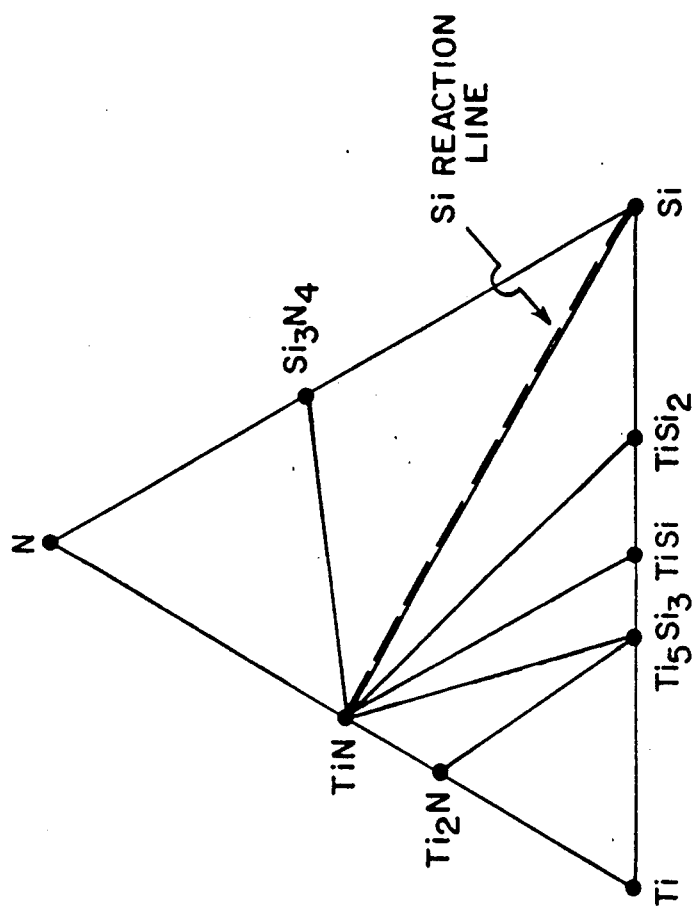
FIGS. 5a and 5b are schematic Ti-N-Si ternary phase diagrams showing reaction lines (FIG. 5a) N with $TiSi_2$ and (FIG. 5b) Si with TiN.
Figure 5A:
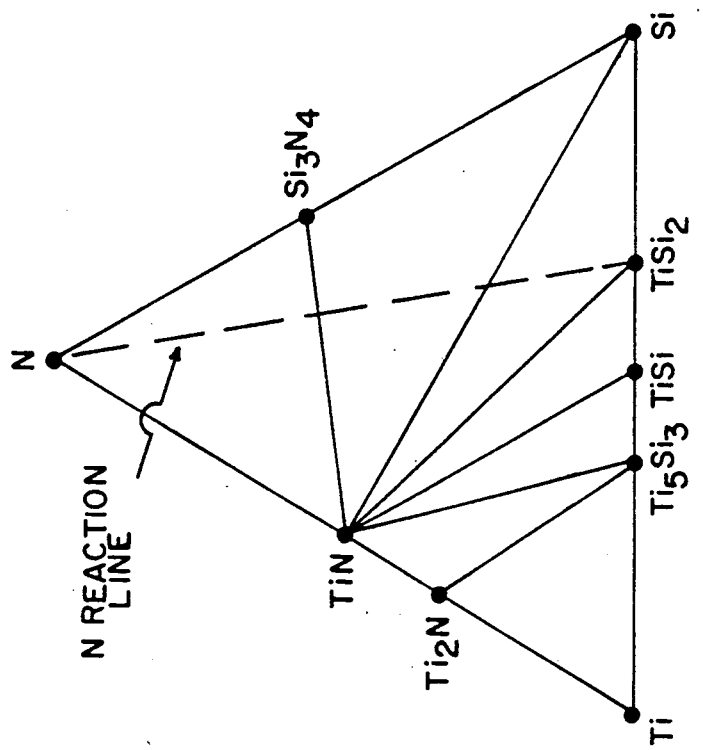

As an example of this first embodiment, the bonding of TiN to $Si_3N_4$ is described with the aid of the Ti-Si-N phase diagram. The bonding of TiN can be enhanced by altering the surface composition of $Si_3N_4$ to, for example, one of the three given by the letters A, B or C in FIG. 2, since these compositions no longer lie along the tie-line joining TiN to $Si_3N_4$. Ion implantation can produce any of these three "altered" $Si_3N_4$ compounds. In a first variant of this embodiment, $Si_3N_4$ is alloyed with Ti by the method of ion implantation. (Inventions pertaining to points B and C will be discussed several paragraphs below.) All possible compositions achievable by alloying $Si_3N_4$ with Ti lie along the dashed line (the Ti-reaction line) in the Si-Ti-N phase diagram in FIG. 2. FIG. 3 gives the percentages of compounds as a function of the percentage of elemental Ti, calculated by the well-known lever rule. At compositions such as those given by point A, the $Si_3N_4$ will react with Ti to form TiN+Si (with hardly any $Si_3N_4$) By implanting to fluences greater than or equal to the composition given by A, the $Si_3N_4$ surface achieves a gradation of phases from TiN rich near the surface to $Si_3N_4$ below the implanted layer. As a specific example, implanting Ti to $5 \times 10^{17}$ ions/$cm^2$ at 170 keV into $Si_3N_4$ heated to about 820° C., produces the graded TiN-to-$Si_3N_4$ interfacial transition layer shown in FIG. 4. A TiN coating deposited on this implanted surface would react with the TiN-rich $Si_3N_4$ surface, enhancing the bonding of the TiN to the surface.

FIGS. 5 and 6a-c further illustrate the alloying concepts elucidated by this first variant in reference to forming adherent $Si_3N_4$ or SiC coatings on related substrates. FIG. 5a depicts the reaction line of N with $TiSi_2$ while FIG. 5b depicts the shows the reaction line of Si with TiN. In the first reaction, it is clear that $Si_3N_4$ is a reaction product for selected concentrations (26% to 54%) of N reacting with $TiSi_2$; hence, N implantation can be used to assist the bonding of $Si_3N_4$ to $TiSi_2$. In the second, Si doesn't react with TiN to form $Si_3N_4$ at any concentration, so Si cannot be implanted into TiN to assist in the bonding of $Si_3N_4$ to TiN. On the other hand, FIGS. 6a-c show that implantation of any of the three elements in the Ti-Si-C system may be used to bond virtually any compound to another. In FIG. 6a, Ti can be used to bond TiC or $TiSi_2$ to SiC; in FIG. 6b, C can be used to bond TiC or SiC to $TiSi_2$; and in FIG. 6c, Si can be used to bond TiC or SiC to $TiSi_2$.

To illustrate methods two, three, and four of the first embodiment, bonding of TiN to $Si_3N_4$ is enhanced by altering the Si/N ratio of $Si_3N_4$. Implantation of Si (method two) or inert-ion (e.g. Ar) bombardment (method three) will enrich the $Si_3N_4$ surface in Si, and is represented by point B in FIG. 2; inert-ion bombardment enriches the surface with Si by the well-known mechanism of preferentially sputtering. In method four, elemental Si is selectively removed from the $Si_3N_4$ surfaces by etching with a Si-sensitive reactive gas or by sputtering $Si_3N_4$ heated to high temperatures. (The latter process is known as thermally-assisted sputtering). In this manner, a N-rich $Si_3N_4$ (point C) might be produced. The latter inventions give three more ways that the surface chemistry of ceramics may be altered in ways that promote adhesion e.g. of TiN coatings to $Si_3N_4$.

The second embodiment of the present invention promotes bonding between coating and substrate materials that do not share a common element. In the second embodiment according to the present invention, the substrate is alloyed with an element of the coating that, when activated, becomes a mobile atomic species that is shared by the substrate and coating and forms a ternary phase that joins the substrate to the coating. The preferred mobile elemental species does lie along a tie-line connected to the substrate material. In this way, the element will not react with the substrate but will dissolve into the coating. Alternatively, where the mobile species reacts with the coating composition, it must be implanted to concentrations above stoichiometric amount to avoid having the mobile species tied up in the reaction products. Sufficiently high concentrations of any element alloyed into the substrate material will introduce that element as an independent phase into the surface of the substrate. Ion implantation is a preferred method of alloying the substrate, but other energetic alloying methods (e.g. ion-beam or laser-beam mixing of preferred mobile species into substrates) are also possible. Once the substrate has been alloyed, the mobile species must be activated in order that it may diffuse into the coating.

Figure 7:
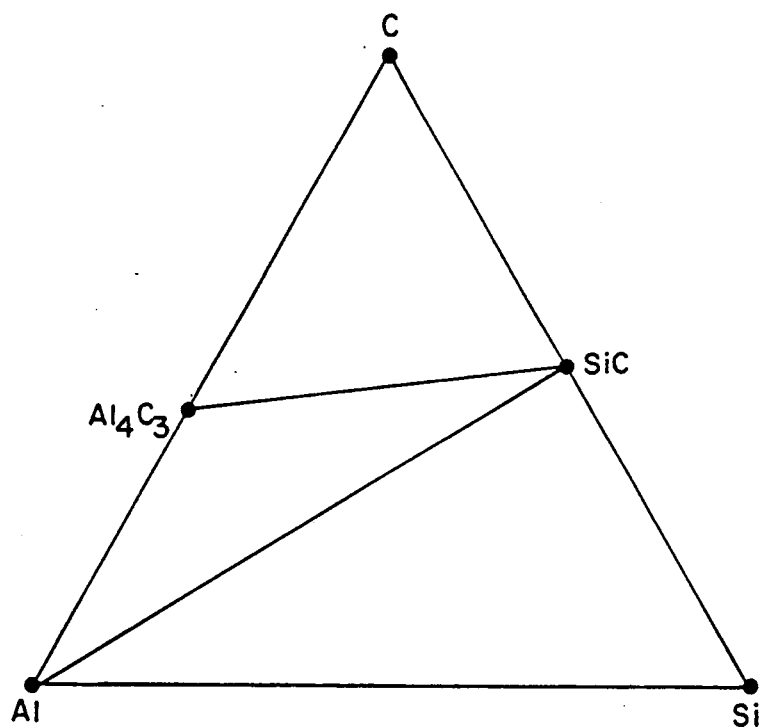
FIG. 7 is a schematic ternary diagram (calculated) for Al-Si-C at high temperature.
Figure 8:
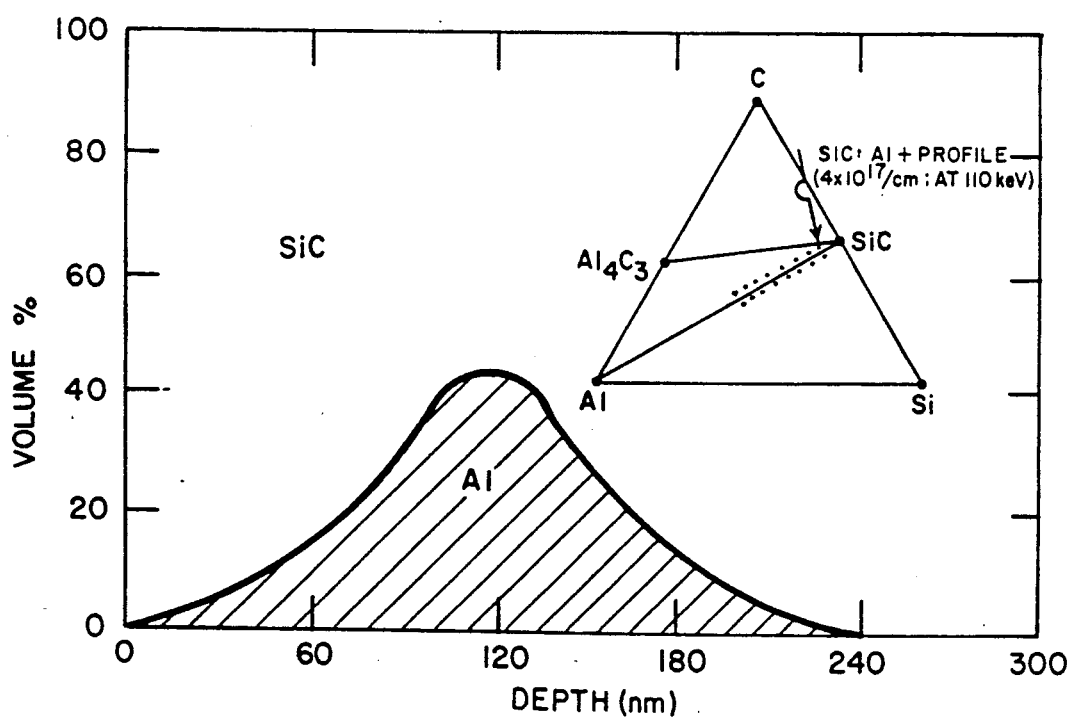
FIG. 8 is a graph of phase concentration vs. depth distribution of Al implanted to $4 \times 10^{17}$ ions/cm² at 110 keV into SiC at about 900° C.

An example of the second embodiment using ion implantation, is the coating of the coating of SiC with $Al_2O_3$. A preferred alloying method, where the implanted species rests along a tie line with the substrate, is $Al^+$ ions implanted into a SiC substrate. As shown in the schematic Si-C-Al ternary diagram in FIG. 7, Al is connected by a tie line to SiC. Composition vs depth profiles of the Al implanted Al to high concentrations (e.g. $4 \times 10^{17}$ ions/cm$^2$ at 110 keV) in SiC are shown in FIG. 8. After implantation, the substrate is coated with $Al_2O_3$ then thermally activated (to temperatures, typically, at or above the melting point of Al, T=660° C.). The free Al diffuses into and mixes with the coating along the interface, forming a ternary phase that enhances the substrate-to-coating adhesion. Bonding is particularly favored where thermal activation occurs in the presence of oxygen. In that case, the oxygen reacts with the free Al as well as SiC, forming a quaternary phase at the interface.

Figure 10:
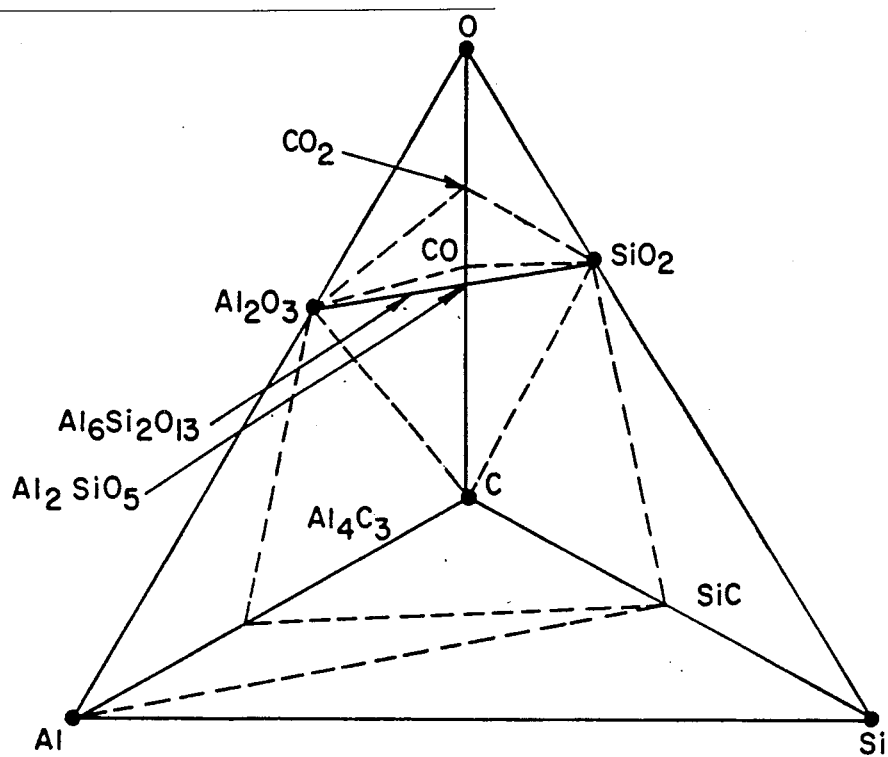
FIG. 10 is a schematic quaternary diagram of the Al-Si-C-O system.
Figure 9:
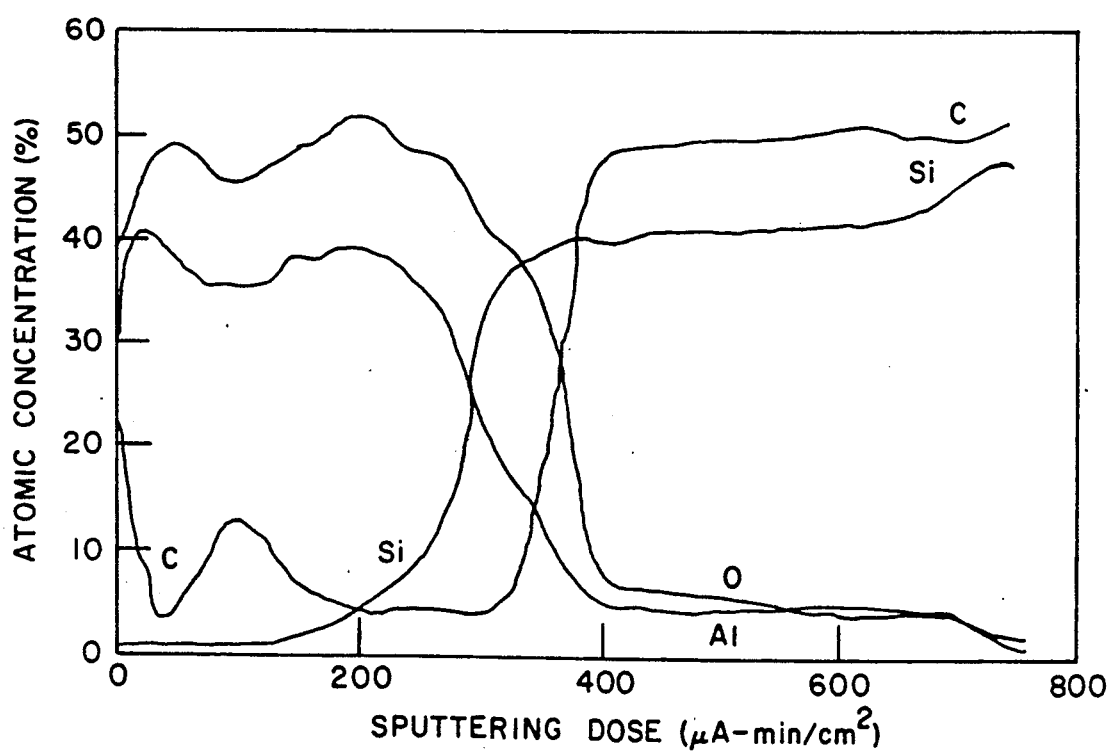
FIG. 9 is an auger sputter depth profile of the coating/interface/ near surface of an $Al_2O_3$ coated, Al-implanted SiC substrate oxidized at 850° C. for 4 hours.
Figure 11:
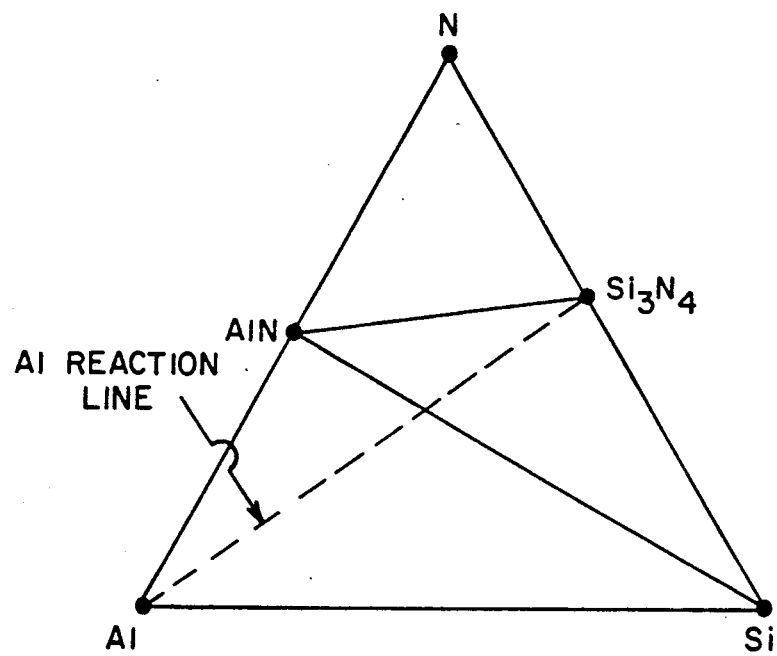
FIG. 11 is a schematic ternary phase diagrams of Si-N-Al.
Figure 12:
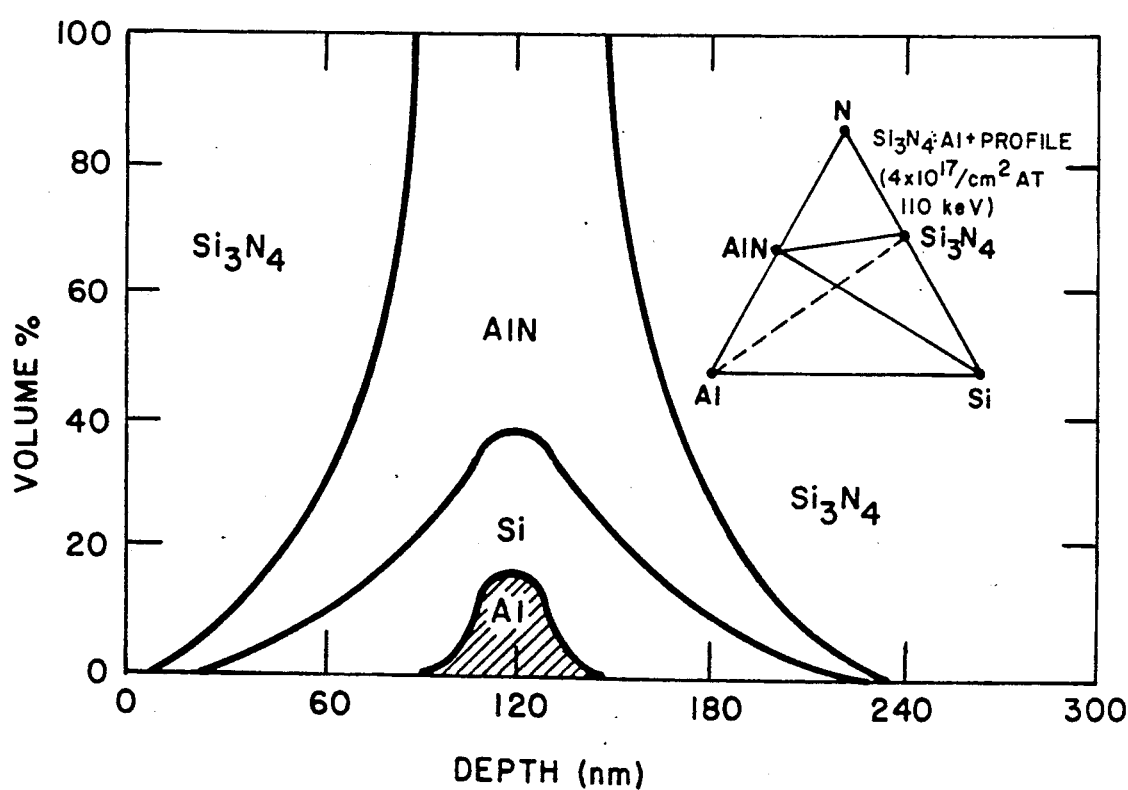
FIG. 12 is a phase vs. depth profile of Al implanted into $Si_3N_4$ ($4 \times 10^{17}$ ions/cm² at 110 keV, T ≈ 900° C.).

Experimental evidence for this behavior is given in FIGS. 9 and 10. A chemical analysis (Auger sputter depth profile) of the coating/interface/near surface of an $Al_2O_3$ coated, Al-implanted SiC substrate oxidized at 850° C. for 4 hours is shown in FIG. 9. The out-diffusion of Al into the $Al_2O_3$ coating and the formation of an Al-Si-O interfacial phase are evident. The existence of interfacial phases between $Al_2O_3$ and SiC is predicted by the calculated phases diagram for the Al-Si-C-O quaternary system, depicted in FIG. 10. Here, one see that the oxidation products of Al in contact with SiC are the ternary phases $Al_2SiO_5$ and $Al_6Si_2O_{13}$. An example of the variant to the second embodiment, where the implanted species and the substrate do not rest along a common tie line, and thus react with each other, is the coating of and $Si_3N_4$ substrate with $Al_2O_3$ using $Al^+$ as the implanted ion. As shown schematically in FIG. 11, low concentrations (less than about 35%) of implanted Al can react with $Si_3N_4$ to form mixtures of AlN, $Si_3N_4$, and Si. At concentrations above 35%, free Al will be present within the substrate. As an example, an equilibrium phase concentration vs depth profile for Al implanted into $Si_3N_4$ at $4 \times 10^{17}$ ions/cm$^2$ at 110 keV is given in FIG. 12. Upon coating and thermal activation, a portion of the free Al diffuses into and mixes with the coating, as described above for the coating of SiC with $Al_2O_3$. Similarly, the presence of oxygen during thermal activation will also enhance the bonding of $Al_2O_3$ coatings to $Si_3N_4$ substrates. However, since less Al is free in $Si_3N_4$ than in SiC, there is less Al available to form the interfacial bonding phase.

Although only two systems have been highlighted to elucidate the methods, many other substrates and coatings can be treated by these embodiments. Preferred ceramic substrates $M_sI_s$ include SiC, $Si_3N_4$, $Al_2O_3$, $B_4C$, $ZrO_2$ and $TiB_2$. Preferred ceramic coatings $M_cI_c$ include the aforementioned ceramics (SiC, $Si_3N_4$, $Al_2O_3$, $B_4C$, $ZrO_2$ or $TiB_2$) in addition to TiN, TiC, $Cr_{23}C_6$, and HfC. Combinations of coatings, substrates, and ion species amenable to the present invention are listed in Table 1.

The present invention is not limited to the use of an ion implantation and bombardment. Indeed, virtually any form of alloying may be used. Energetic beam alloying, however, is preferred, because energetic beams create extremely high effective temperatures in small volume (e.g. the near-surface region) thereby alloying only the selected volume of a workpiece (e.g. the coating-substrate interface). For example, laser alloying and electron beam alloying can also be used to alter the substrate stoichiometry in a manner similar to that accomplished by ion implantation.

The conditions of surface alloying should be sufficient to alter the concentration of the selected component to the extent necessary to render the substrate surface reactive with the coating. The conditions required to achieve this surface reactivity can be determined by theory, according to the surface alloying method used, or empirically, without undue experimentation.

The conditions of activation must also be decided on a case-by-case method. While some surface modification techniques (such as sputtering) create the required nonstoichiometric compositions at the immediate surface of the substrate, other techniques, such as ion implantation of a component of the substrate or coating, cause stoichiometric changes mainly beneath the substrate surface. With both techniques, further treatment, such as heating, may be necessary to activate the thermochemical reactions. Criteria for heating (e.g., the activation temperature) will therefore vary considerably with system: It may be the melting point of a low-melting point elements (e.g. for Al implanted into SiC) or only 70% of the melting point of another compound (e.g. to facilitate grain growth).

The operation of the present invention can be best understood by reference to phase diagrams. Phase diagrams provide a complete description of phase equilibria in multi-component systems. In multi-component systems at equilibrium, Gibbs phase rule must be satisfied, i.e., $P = C - F + 2$, where P is the number of phases, C is the number of components, and F is the number of degrees of freedom. By way of example, for a solid solution of three components at constant temperature and pressure, only two degrees of freedom are possible, i.e., the concentration of two of the three components; hence, for a three component system, the number of phases equals the number of components. In such an isobaric, isothermal section of a ternary phase diagram, a region of three phases in equilibrium is represented by a triangular area whose vertices are the three equilibrium phases; the sides of the triangle are tie lines and the vertices specify the compositions of the three co-existing phases. For simplicity, the ternary phases (invariant points) are ignored and it is assumed that binary compounds are stoichiometric (no bivariant lines).

An equilateral triangle provides a convenient framework for constructing a simplified ternary phase diagram and determining compositions. The three elements are placed at the vertices of the triangle. Binary compounds, known to exist at the specified temperature/pressure conditions, are placed according to some 12 scale, e.g. at. %, at points on the sides of the triangle. The larger triangle is then subdivided into $n+1$ tie triangles (where n is the number of binary compounds) whose vertices define, according to the phase rule, the three phases that determine the composition of any point within the triangle, or two phases if the point lies on a tie line. Tie lines, in other words, connect phases that are stable when brought in contact.

Tie lines are established by calculating the Gibbs free energy of reaction between competing reactions at the point where the two possible tie lines would cross. This calculation is performed by writing balanced equations for all the possible reaction products, such as those given in equations (1) and (2) above and (A1) and (A2) below. Tie lines are then chosen by a process of elimination from those reactions which give the lowest negative free energy. Since free energies vary with temperature, tie lines may switch as the temperature changes. Once the ternary diagram is established, the amounts of each phase present at a point in the diagram can be computed by the lever rule, which is discussed particularly with respect to ternary systems by West, in "Ternary Phase Diagrams," (Macmillan, New York, 1965), incorporated by reference.

In the present specification, several methods for determining tie lines and their switching temperatures were used because the necessary thermochemical data were either inaccurate or contradictory. Calculations were performed for temperatures from 25° C. to 1500° C. In the Si-N-Al case, the reaction

(A1)

gave $\delta G°_{298K} = -120$ kcal/mole, and a tie-line switch would not be expected. However, in the Si-C-Al case, $\delta G°_{298K}$ values for the reaction

(A2)

varied from $-9$ to $+3$ kcal/mole, depending on the method of calculation, so it became necessary to consider that the tie lines might switch at some temperature between 25° C. and the implantation temperature, 900° C.

The first method used room temperature $\delta H°_{298K}$ and $S°_{298K}$ values to approximated $\delta GT = \delta H°_{298K} - T\delta S°_{298K}$. The limitations of this approach are obvious, as it does not take into account the temperature dependence of $\delta H°_{298K}$. This method predicted an $Al_4C_3$-Si tie line up to about 570° C., then a switch to an Al-SiC tie line at higher temperatures. The second method used an algebraic representation for the Gibbs energies of reaction: $\delta G°_T = A + BT \log T + CT$. The solution of these equations indicated the same tie lines but a switch temperature of about 900° C. A third method used tabulated values of the Gibbs function for the various reactants. This method predicted that the Al-SiC tie line is stable over the temperature range 25° to 1500° C. Therefore, the Al-SiC tie line should exist at temperatures above 600° to 900° C., or, perhaps, as low as 25° C.

Further information regarding phase diagrams and the effect of energetic beam implantation or mixing upon ceramics may be found in Singer et al, "Ion-Beam Alloying and Thermochemistry of Ceramics at High Temperatures", Structure-Property Relationships in Surface-Modified Ceramics, 199–208, Kluwer Academic Publishers (1989); Singer et al, "Composition and Structure of $Si_3N_4$ Implanted With $Ti^+$ at 900°"', Mat. Res. Soc. Symp. Proc., Vol. 100 (1988) 201–206; I. L. Singer, "Surface Chemistry and Mechanical Behavior of Silicon Carbide and Silicon Nitride Implanted With Titanium To High Fluences and High Temperatures", Surface and Coatings Technology, 33 (1987) 487–499; and Wei et al, "High Temperature Lubrication of Ceramics by Surface Modification", Surface and Coatings Technology, 37 (1989) 179–192, all of which are incorporated herein by reference.

Having described the invention, the following examples are given to illustrate specific applications of the invention including the best mode now known to perform the invention. These specific examples are not intended to limit the scope of the invention described in this application.

EXAMPLES

EXAMPLE 1

First Embodiment Coating of $Si_3N_4$ substrate with Ti

Figure 13:
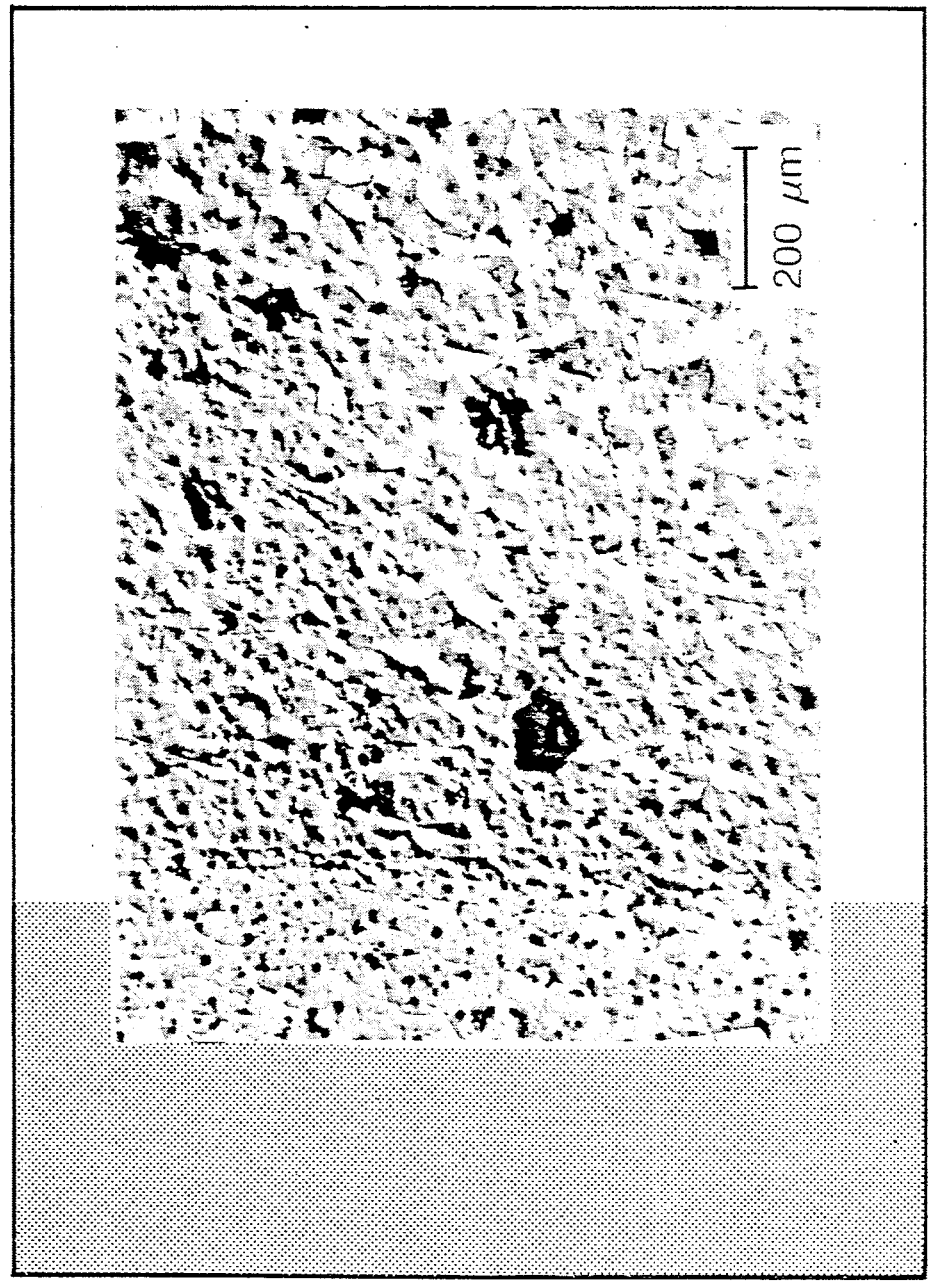
FIG. 13 is a photomicrograph illustrating the improved adhesion of a 0.5 μm thick TiN film, produced by sputtering at 300°, to Ti-implanted $Si_3N_4$ after oxidation (4 hours at 820° C.).
Figure 14:
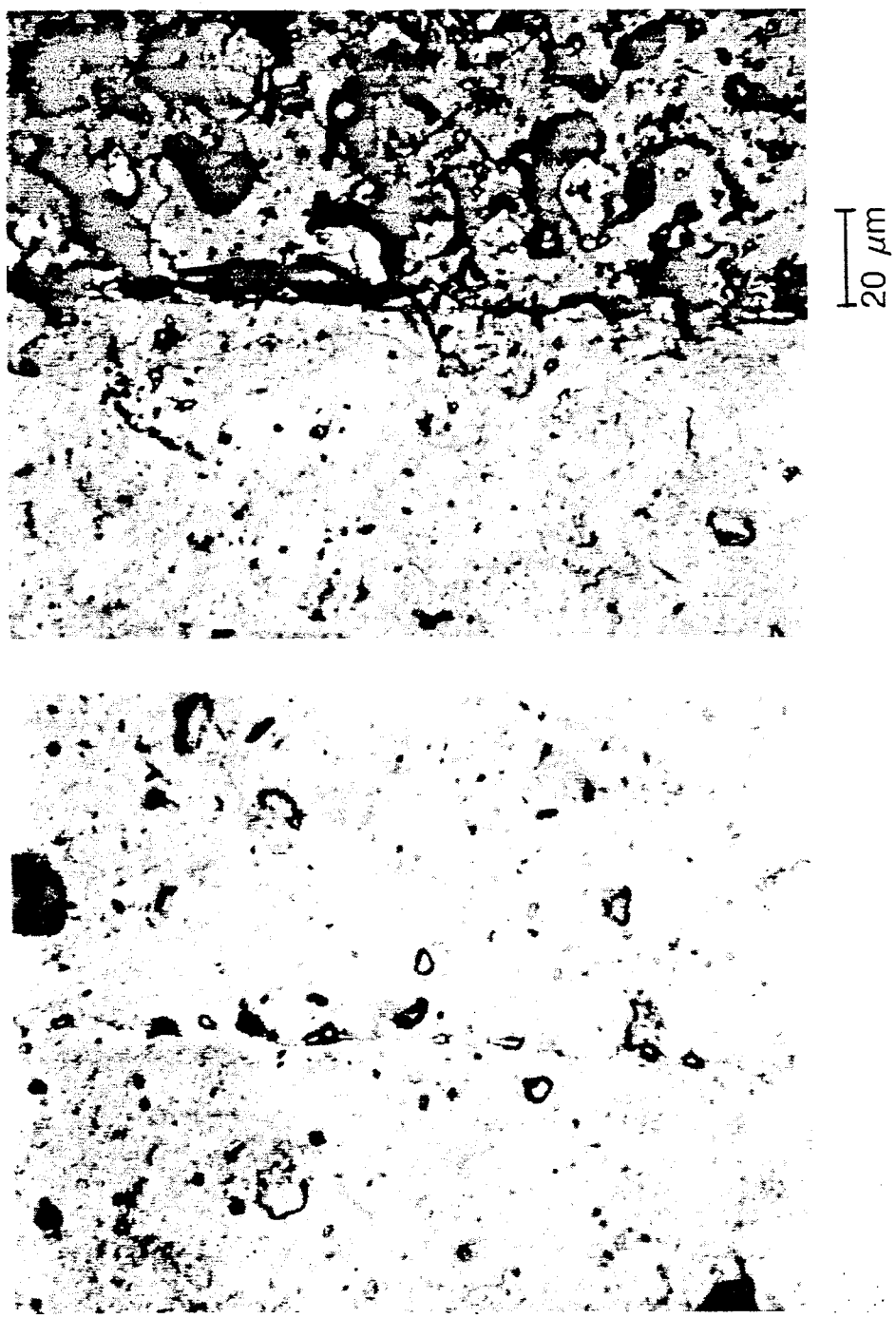
FIG. 14 shows photomicrographs of the improved adhesion of oxidized TiN coatings on Ti-implanted and ion-milled $Si_3N_4$.

One half of a $Si_3N_4$ substrate was implanted with Ti ions ($4 \times 10^{17}$ ions/cm$^2$ at 190 keV), producing a ($Si_3N_4$ +Ti) surface layer. In addition, a small area of the $Si_3N_4$ substrate was $Ar^+$-ion etched to a depth of 0.2 μm. TiN was subsequently deposited on the Ti-implanted, ion-etched and non-implanted halves of the substrate. The TiN-coated substrate was next heated in oxygen to about 820° C. for several hours then allowed to cool slowly. As seen in the light microscope photographs in FIG. 13, the thermally stressed and oxidized coating on the non-implanted side cracked and flaked off, presumably the result of the poor adhesion and the strain mismatch during thermal cycling. By contrast, the coating on the Ti-implanted side remained intact under the same thermal cycling. FIG. 14 shows that the coating also adhered well to the ion-etched area.

EXAMPLE 2

Second Embodiment (a) Coating of SiC with $Al_2O_3$

Figure 15A:
FIGS. 15a and 15b show wear tracks of an $Al_2O_3$ coated, Al-implanted SiC substrate.
Figure 15B:
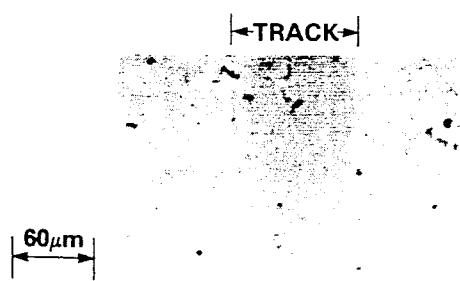

Al was implanted ($4 \times 10^{17}$ ions/cm$^2$ at 110 keV) into a SiC substrate, which was subsequently coated with $Al_2O_3$ by e-beam evaporation; the substrate was not intentionally heated during the coating process. Next, the substrate was heated in air to 850° C. (nearly 200° C. above the melting temperature of Al, about 660° C.). A scratch test was used to evaluate the adhesion of the coating before and after heat treatment. In this test, a $Si_3N_4$ ball is loaded to a mean contact stress of 2.1 GPa then slid repeatedly (in air, without lubrication, and at low speed (0.1 mm/sec)) against the substrate. Before the heat treatment, the $Al_2O_3$ coating spalled off after two pass and the friction coefficient rose to 0.8. After heat/oxidation treatment, the coating showed no film failure and a low friction coefficient (0.2) even after 20 passes of sliding. The results are shown in FIGS. 15a (before treatment) and 15b (after treatment).

(b) Coating of $Si_3N_4$ with $Al_2O_3$

Al was implanted ($4 \times 10^{17}$ ions/cm² at 110 keV) into a $Si_3N_4$ substrate, coated, heat activated and tested under conditions identical to those described in example 2a. Although the friction coefficient on the $Si_3N_4$ substrate was initially as low as that on the SiC substrate, the $Al_2O_3$ coating began to delaminate at spots on the $Si_3N_4$ substrate, causing the friction coefficient to increase. We attribute the poorer adhesion on the $Si_3N_4$ substrate to the lower concentration of free Al able to react with and bond to the $Al_2O_3$ coating.

The present invention, by permitting, for the first time, the coating of strong, light and thermally stable substrates with wear, corrosion and oxidation-resistant ceramic materials, vastly increases the availability of materials for high temperature, oxygen and/or water-containing environments. Products made according to the present invention uniquely combine excellent engineering characteristics with excellent surface oxidation and wear-resistance.

Obviously, many modifications and variations of the present invention are possible in light of the above teachings. It is therefore to be understood that, within the scope of the appended claims, the invention may be practiced otherwise than as specifically described.

What is claimed is:

1. A method of coating a self-supporting substrate with a coating material different from and thermodynamically stable to said substrate, comprising the steps of:
   ion implanting or surface alloying said substrate by means of an energetic beam in such a manner as to enrich said substrate with respect to an element of said substrate or coating material, or an element selected from the same periodic group as an element of said substrate or coating material, and thus form a phase within said substrate, said phase comprising a mobile atomic species, which is diffusible into or reactive with said coating material;
   coating said ion implanted or surface alloyed substrate with said coating material to form an interface between said substrate and said coating material;
   thermally activating said interface to move said mobile atomic species to said interface and diffuse said mobile atomic species into said coating material and, thereby bonding said coating material to said substrate.

2. The method of claim 1, wherein said substrate is a ceramic $M_sI_s$ and said coating is a ceramic $M_cI_c$, wherein $M_s$ and $M_c$ are metals and $I_s$ and $I_c$ are insulator elements.

3. The method of claim 2, wherein said activating step comprises heating said coated ceramic substrate.

4. The method of claim 2, wherein said coating material and ceramic substrate are coating/substrate pairs selected from the group consisting of $Al_2O_3$/SiC, $Al_2O_3$/$Si_3N_4$, NbC/$Si_3N_4$ and HfC/$Si_3N_4$.

5. The method of claim 1, comprising ion implanting said ions or ionic species.

6. The method of claim 5, wherein said substrate is SiC, said coating material is $Al_2O_3$, and said implanted species is Al.

7. The method of claim 5, wherein said substrate is $Si_3N_4$, said coating material is $Al_2O_3$, and said implanted species is Al.

8. A method of coating a self-supporting ceramic substrate $M_sI_s$ with a ceramic $M_c I_c$ coating material different from and thermodynamically stable to said ceramic substrate, wherein $M_s$ and $M_c$ are metals and $I_s$ and $I_c$ are insulator elements, comprising the steps of:
   preferentially sputtering $I_s$ from the surface of said substrate to be coated, by bombarding said substrate surface with an inert ion, to form an $M_c$-including phase within said substrate which is diffusable into or reactive with said coating material;
   coating said ion-bombarded substrate with said coating material to form an interface between said substrate and said coating material; and
   intermixing said ceramic coating material and said ceramic substrate along said interface, thereby bonding said ceramic coating material to said ceramic substrate.

9. The method of claim 8, wherein said intermixing step comprises heating said coated ceramic substrate.

10. The method of claim 8, wherein said substrate is $Si_3N_4$, said coating material is TiN, and said preferential sputtering is performed by implanting $Ar^+$ into said substrate, to preferentially sputter N from said substrate and form an Si-rich surface upon said substrate.

* * * * *